(12) United States Patent
Chiang

(10) Patent No.: US 9,125,335 B2
(45) Date of Patent: Sep. 1, 2015

(54) CERAMIC CIRCUIT BOARD AND METHOD OF MAKING THE SAME

(71) Applicant: Tong Hsing Electronic Industries, Ltd., Taipei (TW)

(72) Inventor: Wen-Chung Chiang, Lujhu Township (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 182 days.

(21) Appl. No.: 13/862,298

(22) Filed: Apr. 12, 2013

(65) Prior Publication Data
US 2013/0228273 A1    Sep. 5, 2013

Related U.S. Application Data

(62) Division of application No. 12/800,291, filed on May 11, 2010, now abandoned.

(30) Foreign Application Priority Data

May 15, 2009    (TW) .............................. 98116190 A

(51) Int. Cl.
*H05K 3/20* (2006.01)
*H05K 13/00* (2006.01)
(Continued)

(52) U.S. Cl.
CPC ............ *H05K 13/00* (2013.01); *H01L 23/3677* (2013.01); *H01L 23/3735* (2013.01);
(Continued)

(58) Field of Classification Search
CPC .............. H01L 23/3731; H01L 23/367; H01L 23/3677; H01L 23/3735; H01L 2224/48227; H01L 2224/49107; H01L 2924/01322; H01L 2924/00; H05K 1/0204; H05K 1/0306; H05K 2201/0355; H05K 2201/10416; H01K 13/00; Y10T 156/10; Y10T 156/1056; Y10T 156/1057; Y10T 29/49128; Y10T 29/49124; Y10T 29/49117; Y10T 29/49002; Y10T 29/49126; Y10T 29/4913; Y10T 29/49142; Y10T 29/49144; Y10T 29/49155; Y10T 29/49163
USPC ........ 29/831, 829, 825, 592.1, 830, 832, 839, 29/840, 846, 851; 174/252; 156/60, 252, 156/253, 308.2; 361/704, 700, 705
See application file for complete search history.

(56) References Cited

U.S. PATENT DOCUMENTS 7,518,219 B2    4/2009    Bish et al.
8,127,441 B2 *  3/2012    Tuan et al. ...................... 29/846
(Continued)

OTHER PUBLICATIONS

Search Report of TW Patent Application No. 098116190, 2 pages, dated Jul. 24, 2012.

*Primary Examiner* — Peter DungBa Vo
*Assistant Examiner* — Azm Parvez
(74) *Attorney, Agent, or Firm* — Kilpatrick Townsend & Stockton, LLP

(57) ABSTRACT

A ceramic circuit board for use in packaging an electronic element includes a ceramic-copper plate, and a heat-dissipating unit that is adapted for dissipating heat from the electronic element. The ceramic-copperplate includes a ceramic substrate that has opposite first and second surfaces, and a through-hole formed through the first and second surfaces, a top copper pattern that overlies the first surface of the ceramic substrate and that has at least two conducting portions spaced apart from each other, and a bottom copper layer that underlies the second surface of the ceramic substrate. The heat-dissipating unit includes a heat-dissipating layer that is disposed in the through-hole of the ceramic substrate above the bottom copper layer and that has a thermal conductivity larger than that of the ceramic substrate. A method of making the ceramic circuit board is also disclosed.

11 Claims, 7 Drawing Sheets

(51) Int. Cl.
   H01L 23/367 (2006.01)
   H01L 23/373 (2006.01)
   H05K 1/02 (2006.01)
   H01L 33/48 (2010.01)
   H05K 1/03 (2006.01)
(52) U.S. Cl.
   CPC ............ *H05K1/0204* (2013.01); *H01L 33/486* (2013.01); *H01L 2224/48227* (2013.01); *H01L 2224/49107* (2013.01); *H01L 2924/01322* (2013.01); *H05K 1/0306* (2013.01); *H05K 2201/0355* (2013.01); *H05K 2201/10416* (2013.01); *Y10T 29/49128* (2015.01); *Y10T 156/10* (2015.01); *Y10T 156/1056* (2015.01); *Y10T 156/1057* (2015.01)

(56) References Cited

U.S. PATENT DOCUMENTS

2004/0218363 A1* 11/2004 Wong ............................ 361/704
2007/0290307 A1   12/2007 Lin
2010/0103623 A1    4/2010 Kwank et al.

* cited by examiner

CERAMIC CIRCUIT BOARD AND METHOD OF MAKING THE SAME

CROSS REFERENCE TO RELATED APPLICATIONS

This patent application is a divisional of U.S. patent application Ser. No. 12/800,291, filed May 11, 2010, which claims priority to Taiwanese Application No. 098116190, filed May 15, 2009, the full disclosures of which are incorporated herein by reference in their entirety.

BACKGROUND OF THE INVENTION

1. Field of the Invention

This invention relates to a ceramic circuit board, more particularly to a ceramic circuit board including a heat-dissipating unit and to a method of making the same.

2. Description of the Related Art

Normally, a conventional ceramic circuit board is a ceramic-copper plate that is formed by eutectic-bonding a ceramic substrate made of, e.g., $Al_2O_3$, AlN, $TiO_2$, $ZrO_2$, ZnO, $2MgO.SiO_2$, or $BaTiO_3$, and copper foils using direct copper bonding (DCB). The ceramic substrate has electrical insulating ability, thereby being able to insulate a plurality of electronic components disposed on the conventional ceramic circuit board.

Referring to FIG. 1, a conventional ceramic circuit board 1 is shown, and a method of making the same includes (A) providing a ceramic substrate 10, and first and second copper foils 11,12, (B) eutectic-bonding the first and second copper foils 11,12 respectively to top and bottom surfaces of the ceramic substrate 10, and (C) patterning the first copper foil 11 to form two spaced apart conducting portions 111.

Referring to FIG. 2, the ceramic circuit board 1 is used for packaging an electronic component such as a horizontally structured light emitting diode (LED) 91. Generally, the ceramic substrate 10 is formed by virtue of a conventional ceramic-making process (e.g., tape casting, slip casting, or pressing). However, the ceramic substrate 10 made by the conventional ceramic-making process has a thickness larger than 0.2 mm such that the ceramic substrate 10 is too thick for the horizontally structured LED 91 in terms of heat-dissipation. The ceramic substrate 10 is unable to efficiently transfer heat generated by the horizontally structured LED 91, thereby reducing the service life of the electronic component and adversely affecting the efficiency of the electronic component.

SUMMARY OF THE INVENTION

Therefore, the object of the present invention is to provide a ceramic circuit board that can overcome the aforesaid drawbacks of the prior art, and a method of making the same.

According to one aspect of this invention, a ceramic circuit board for use in packaging an electronic element includes a ceramic-copper plate, and a heat-dissipating unit that is adapted for dissipating heat from the electronic element.

The ceramic-copper plate includes a ceramic substrate that has opposite first and second surfaces, and a through-hole formed through the first and second surfaces, a top copper pattern that overlies the first surface of the ceramic substrate and that has at least two conducting portions spaced apart from each other, and a bottom copper layer that underlies the second surface of the ceramic substrate.

The heat-dissipating unit includes a heat-dissipating layer that is disposed in the through-hole of the ceramic substrate above the bottom copper layer and that has a thermal conductivity larger than that of the ceramic substrate.

According to another aspect of this invention, a method of making a ceramic circuit board for use in packaging an electronic element comprises: (a) providing a ceramic-copper plate that includes top and bottom copper layers, a ceramic substrate between the top and bottom copper layers, and a through-hole formed in the ceramic substrate; and (b) providing a heat-dissipating unit on the bottom copper layer and within the through-hole for dissipating heat from the electronic element.

BRIEF DESCRIPTION OF THE DRAWINGS

Other features and advantages of the present invention will become apparent in the following detailed description of the preferred embodiments of this invention, with reference to the accompanying drawings, in which.

DETAILED DESCRIPTION OF THE PREFERRED EMBODIMENTS

Figure 1:
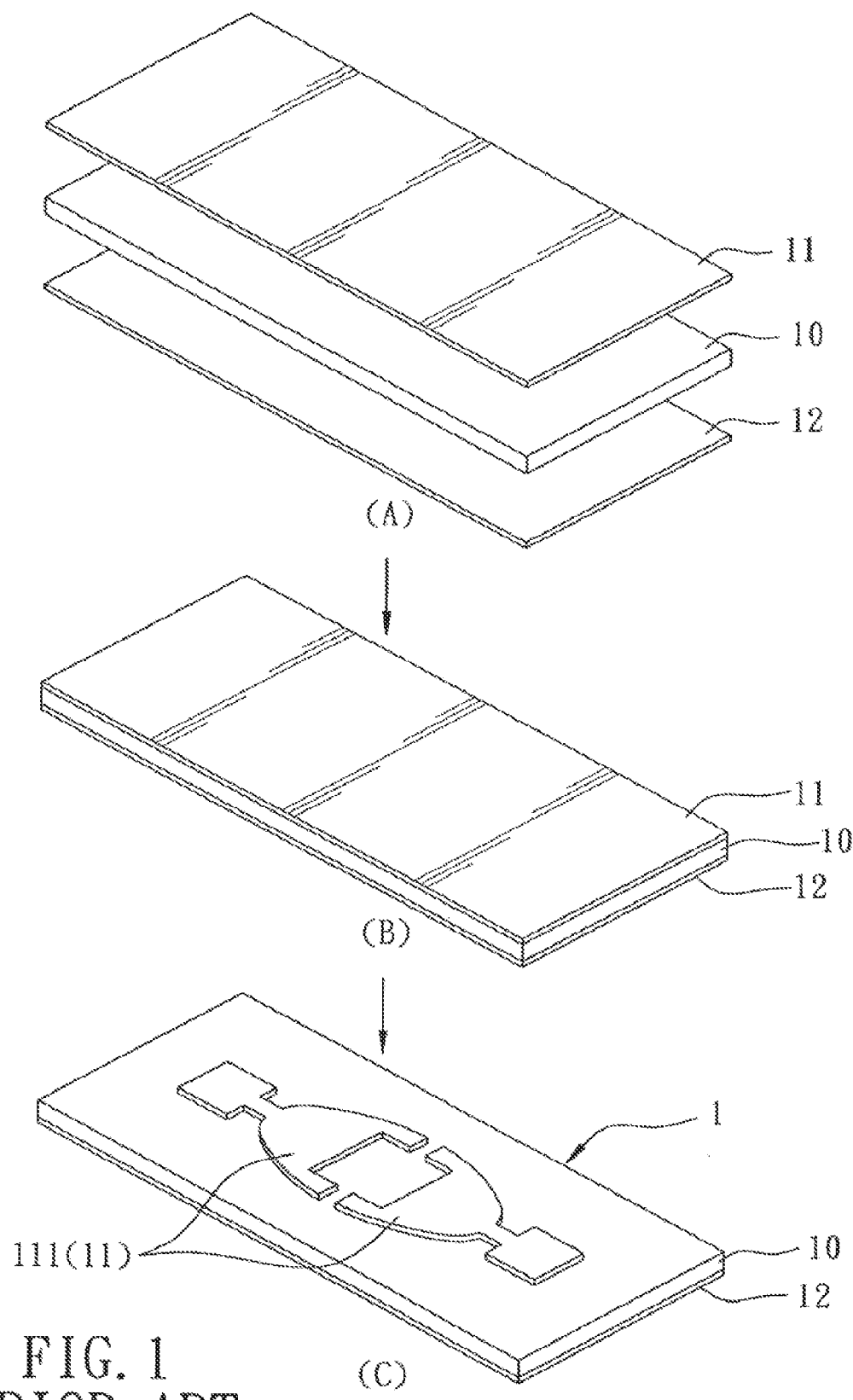
FIG. 1 shows consecutive steps of making a conventional ceramic circuit board.
Figure 2:
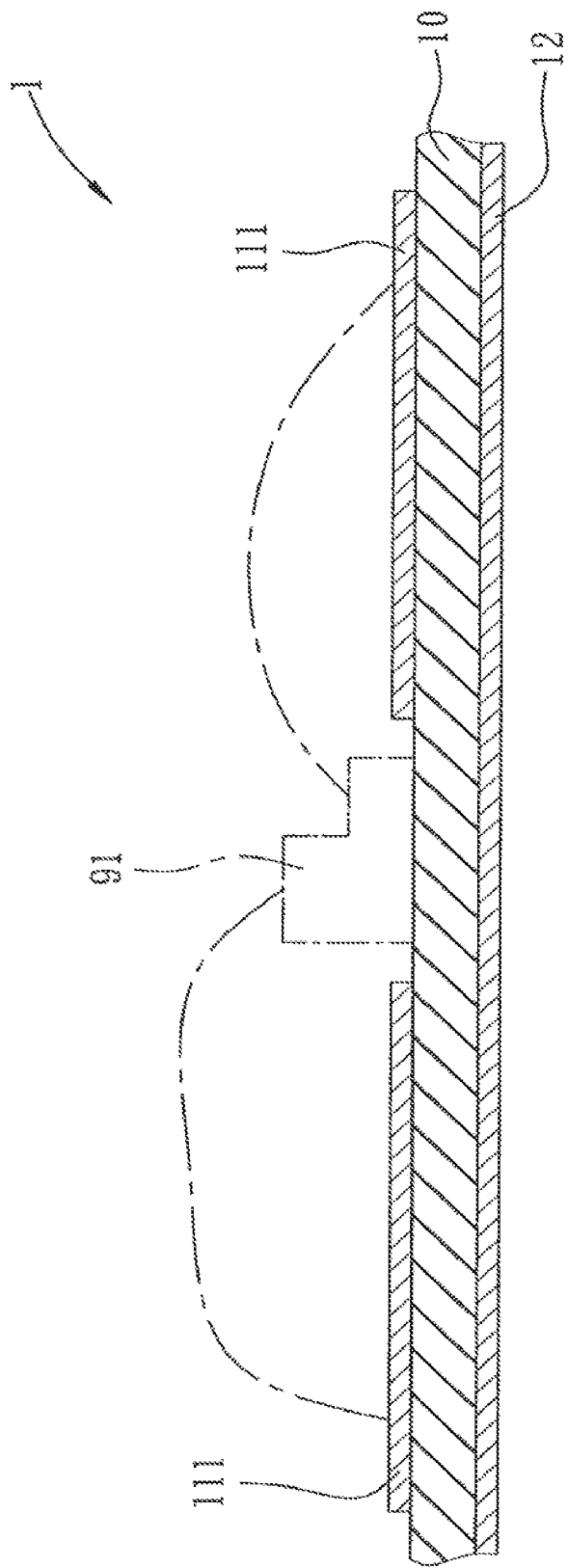
FIG. 2 is a schematic fragmentary sectional view to illustrate a conventional ceramic circuit board adapted for packaging a horizontally structured light emitting diode.

Before the present invention is described in greater detail, it should be noted that the same reference numerals have been used to denote like elements throughout the specification.

Figure 3:
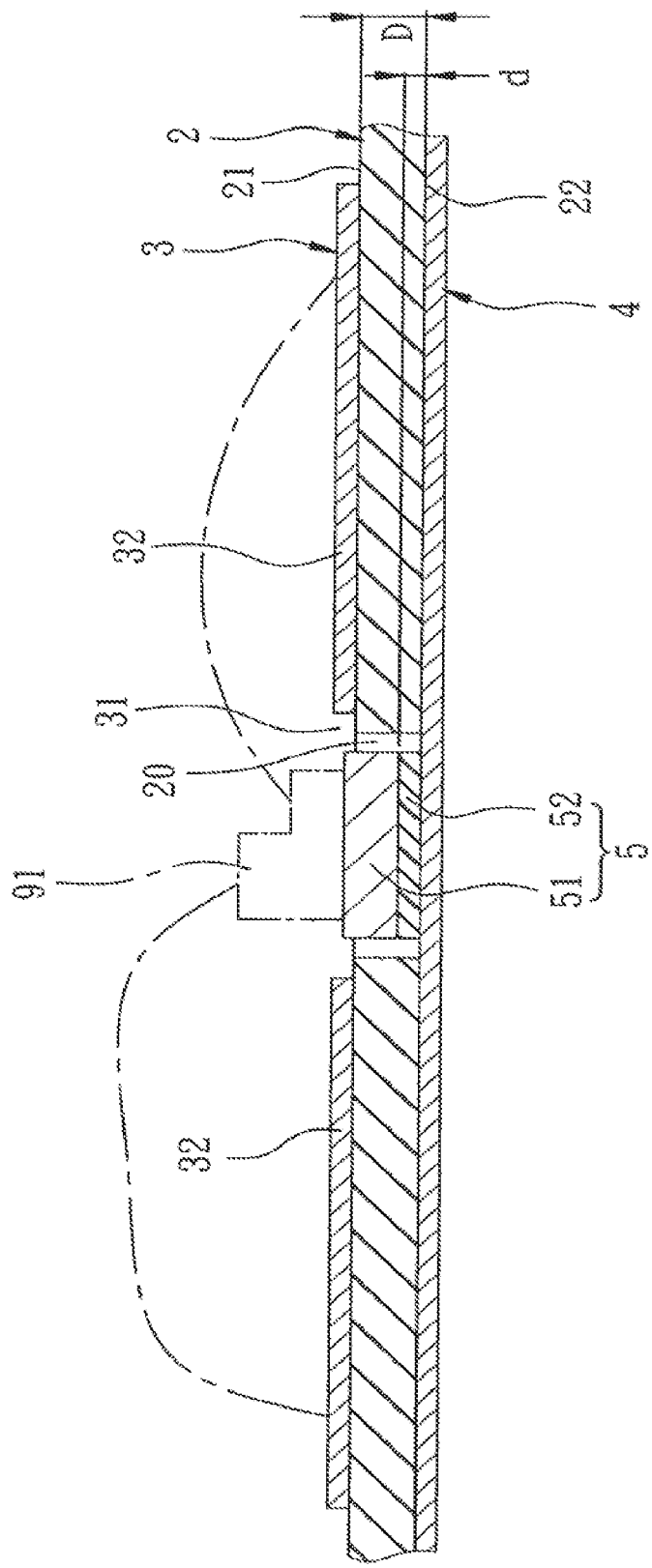
FIG. 3 is a schematic fragmentary sectional view to illustrate the first preferred embodiment a ceramic circuit board according to the present invention, which is used for packaging a horizontally structured light emitting diode.

Referring to FIG. 3, the first preferred embodiment of a ceramic circuit board according to the present invention is adapted to be electrically connected to at least one electronic element, such as a horizontally structured light emitting diode (LED) 91, and includes a ceramic-copper plate and a heat-dissipating unit 5.

The ceramic-copper plate includes a ceramic substrate 2 that has opposite first and second surfaces 21,22, and a through-hole 20 formed through the first and second surfaces 21,22, a top copper pattern 3 that overlies the first surface 21 of the ceramic substrate 2 and that has two conducting portions 32 spaced apart from each other, and a bottom copper layer 4 that underlies the second surface 22 of the ceramic substrate 2. The top copper pattern 3 further has a gap 31 that separates the two conducting portions 32 and that completely exposes the through-hole 20 of the ceramic substrate 2. It should be noted that the top copper pattern 3 might have more than two conducting portions 32 spaced apart from each other so as to be electrically connected to a plurality of electronic elements.

The heat-dissipating unit 5 is adapted for dissipating heat from the electronic element (e.g., the horizontally structured LED 91), and includes a heat-dissipating layer 51 that is disposed in the through-hole 20 of the ceramic substrate 2 above the bottom copper layer 4. The heat-dissipating unit 5 further includes a ceramic layer 52 that lies between the heat-dissipating layer 51 and the bottom copper layer 4 of the ceramic-copper plate. The ceramic layer 52 may be made from $Al_2O_3$, AlN, or $TiO_2$.

When the first preferred embodiment of the ceramic circuit board is used for an electronic element (such as the horizontally structured LED 91) that has an insulating bottom portion, the ceramic layer 52 is not required. When the first preferred embodiment of the ceramic circuit board is used for an electronic element (such as a vertically structured LED or a concentrator photovoltaic cell) that has a conductible bottom portion, the ceramic layer 52 is required.

In order to increase heat-dissipating efficiency of the ceramic circuit board, preferably, the heat-dissipating layer 51 has a thermal conductivity larger than that of the ceramic substrate 2 of the ceramic-copper plate, and the ceramic layer 52 of the heat-dissipating unit 5 has a thickness (d) smaller than a thickness (D) of the ceramic substrate 2 of the ceramic-copper plate. Generally, the thickness (D) of the ceramic substrate 2 of the ceramic-copper plate is larger than 0.2 mm. When the thickness (d) of the ceramic layer 52 of the heat-dissipating unit 5 is not sufficient, internal pores of the ceramic layer 52 may greatly reduce breakdown voltage of the ceramic layer 52. Therefore, preferably, the thickness (d) of the ceramic layer 52 ranges from 0.02 mm to 0.2 mm. The thermal conductivity of the heat-dissipating layer 51 is larger than 170 $Wm^{-1}K^{-1}$. The heat-dissipating layer 51 may be made of copper having a thermal conductivity of about 401 $Wm^{-1}K^{-1}$, a Cu/W alloy having a thermal conductivity of about 209 $Wm^{-1}K^{-1}$, or a Cu/Mo alloy having a thermal conductivity of about 184 $Wm^{-1}K^{-1}$.

The ceramic layer 52 of the heat-dissipating unit 5 may be formed by a thermal spraying technique or a plasma spraying technique. The heat-dissipating layer 51 in this embodiment is made of copper. The ceramic layer 52 of the heat-dissipating unit 5 and the bottom copper layer 4 of the ceramic-copper plate are sinter-bonded (e.g., eutectic bonding) to each other by virtue of a heat treatment at a temperature, which is lower than the melting point of copper (about 1083° C.) and higher than the eutectic temperature of the copper-copper oxide eutectic (about 1065° C.)

Figure 4:
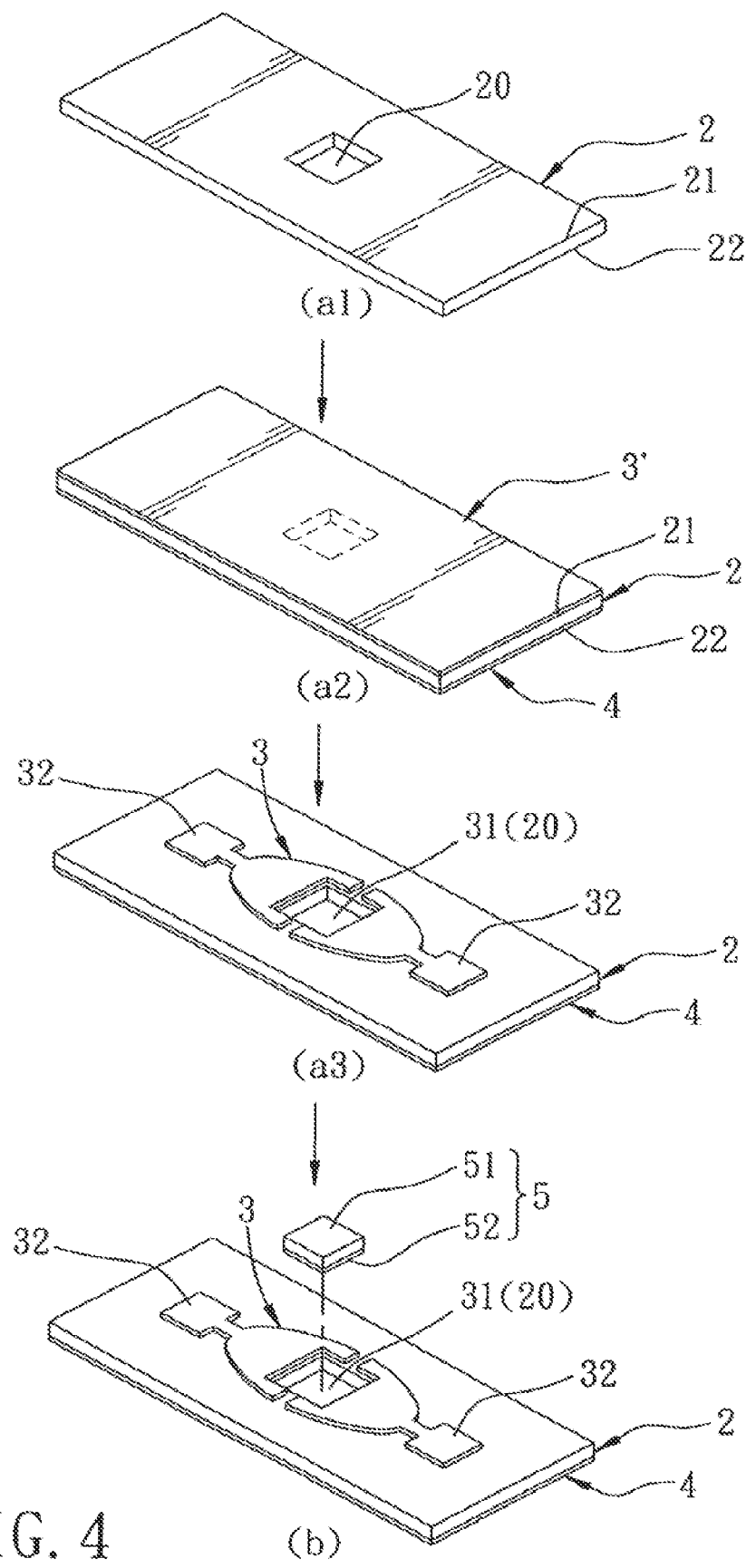
FIG. 4 shows consecutive steps of the first preferred embodiment of a method for making the ceramic circuit board shown in FIG. 3.
Figure 5:
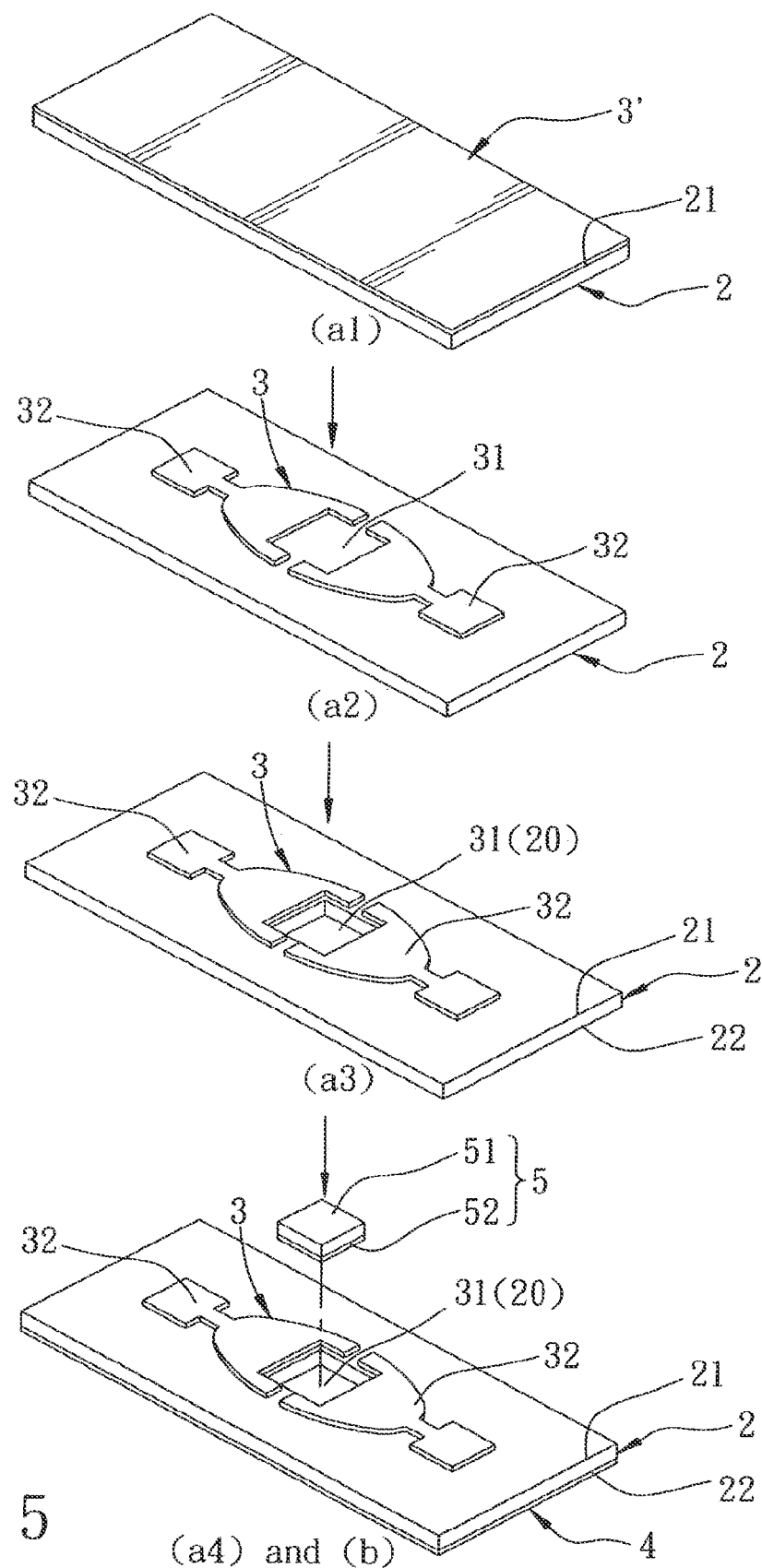
FIG. 5 shows consecutive steps of the second preferred embodiment of a method for making the ceramic circuit board shown in FIG. 3.
Figure 7:
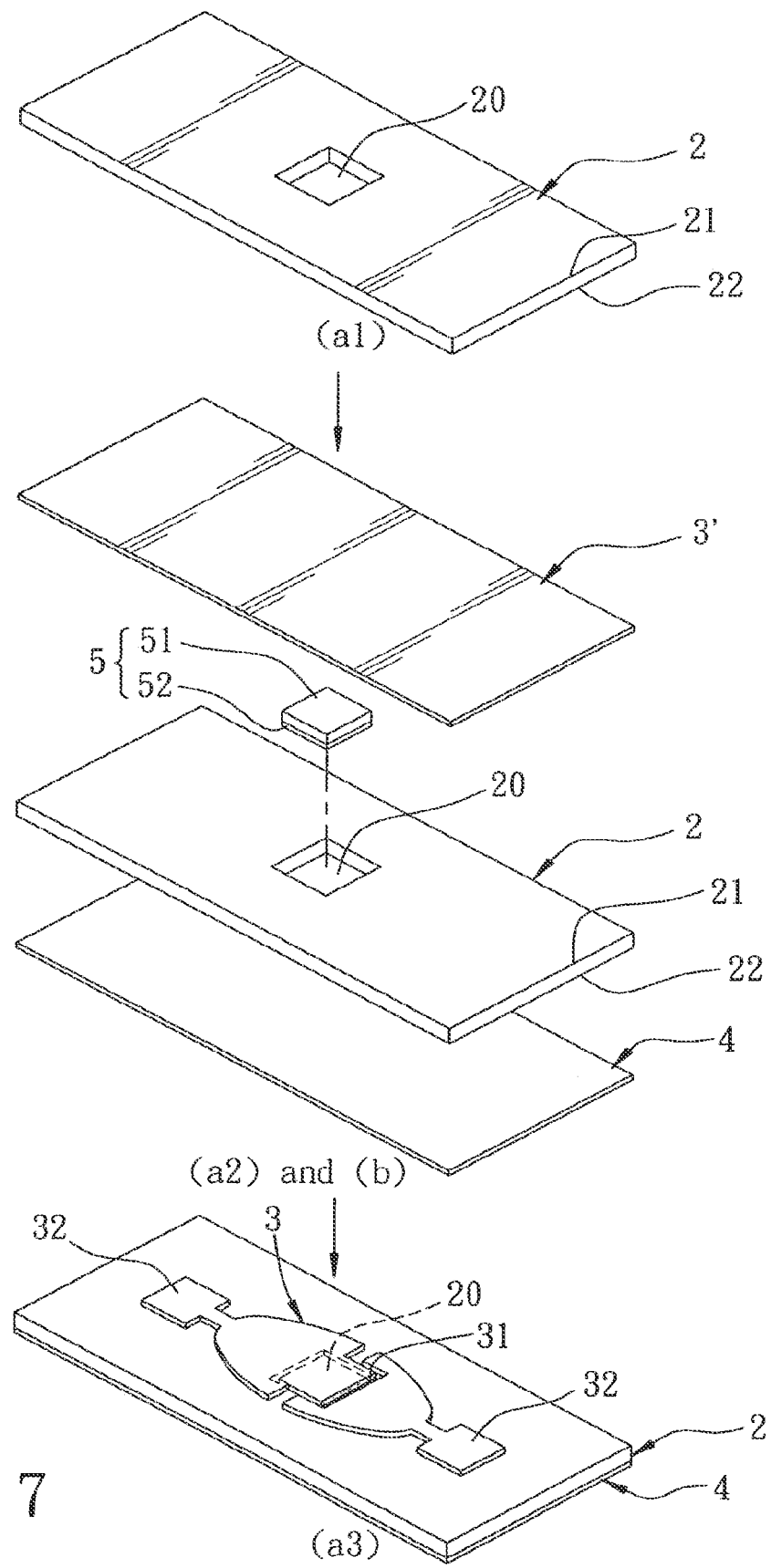
FIG. 7 shows consecutive steps of the third preferred embodiment of a method for making the ceramic circuit board shown in FIG. 6.

Referring to FIGS. 4, 5, and 7, a method of making the ceramic circuit board includes: (a) providing the ceramic-copper plate that includes a top copper layer 3' and the bottom copper layer 4, the ceramic substrate 2 between the top and bottom copper layers 3',4, and the through-hole 20 formed in the ceramic substrate 2; and (b) providing the heat-dissipating unit 5 on the bottom copper layer 4 and within the through-hole 20 for dissipating heat from the electronic element.

Referring to FIG. 4, the first preferred embodiment of the method according to the present invention is conducted to make the ceramic circuit board as shown in FIG. 3, and step (a) thereof includes: (a1) forming the through-hole 20 that extends through the first and second surfaces 21,22 of the ceramic substrate 2; (a2) sinter-bonding the top and bottom copper layers 3',4 respectively to the first and second surfaces 21,22 of the ceramic substrate 2 after step (a1); and (a3) patterning the top copper layer 3' to form the two conducting portions 32, and the gap 31 that separates the two conducting portions 32 and that completely expose the through-hole 20 after step (a2). In step (b) of the first preferred embodiment of the method, the heat-dissipating unit 5 is provided on the bottom copper layer 4 in the through-hole 20 of the ceramic substrate 2 via a sinter-bonding process.

In this embodiment, step (a1) may be performed using $CO_2$ laser having power larger than 100 W so as to cut the ceramic substrate 2, thereby forming the through-hole 20. Step (a1) of the first preferred embodiment of the method is suitable to form the through-hole 20 that has a small size. A cross-section of the through-hole 20 may be square, circular, or polygonal. If the size of the through-hole 20 is unduly large, the ceramic substrate 2 may be damaged since both of the top and bottom copper layers 3',4 may go through expansion and contraction during step (a2) such that both of the top and bottom copper layers 3',4 may exert thermal stress on the ceramic substrate 2, and the top copper layer 3' may be deformed such that the quality of the top copper pattern 3 may be influenced. Consequently, preferably, the first preferred embodiment of the method is conducted to form the through-hole 20 having the size that is approximately smaller than 5 mm.

Referring to FIG. 5, the second preferred embodiment of the method according to the present invention is performed to make the ceramic circuit board as shown in FIG. 3 as well, and step (a) thereof includes: (a1) sinter-bonding the top copper layer 3' to the first surface 21 of the ceramic substrate 2; (a2) patterning the top copper layer 3' to form the two conducting portions 32 and the gap 31 that separates the two conducting portions 32 after step (a1); (a3) forming the through-hole 20 in the ceramic substrate 2 after step (a2); and (a4) sinter-bonding the bottom copper layer 4 to the second surface 22 of the ceramic substrate 2 opposite to the first surface 21 through the heat treatment after step (a3). In step (b) of the second preferred embodiment of the method, the heat-dissipating unit 5 is provided on the bottom copper layer 4 in the through-hole 20 of the ceramic substrate 2 via a sinter-bonding process. In this embodiment, steps (a4) and (b) are conducted together after step (a3).

Since step (a2) (formation of the top copper pattern 3) is performed before step (a3) (formation of the through-hole 20), in steps (a4) and (b), thermal stress exerted by the top copper pattern 3 and the bottom copper layer 4 is smaller than the aforementioned thermal stress exerted by the larger top copper layer 3' and the bottom copper layer 4. Therefore, step (a3) of the second preferred embodiment of the method is suitable to form the through-hole 20 having a larger size compared to step (a2) of the first preferred embodiment of the method. Preferably, the second preferred embodiment of the method is conducted to form the through-hole 20 having the size larger than 5 mm. In contrast with the through-hole 20 formed using the first preferred embodiment of the method, the larger through-hole 20 formed by virtue of the second preferred embodiment of the method is able to accommodate the larger heat-dissipating unit 5. Thus, the heat generated by the electronic element (e.g., the horizontally structured LED 91 as shown in FIG. 3) can be more efficiently dissipated.

Figure 6:
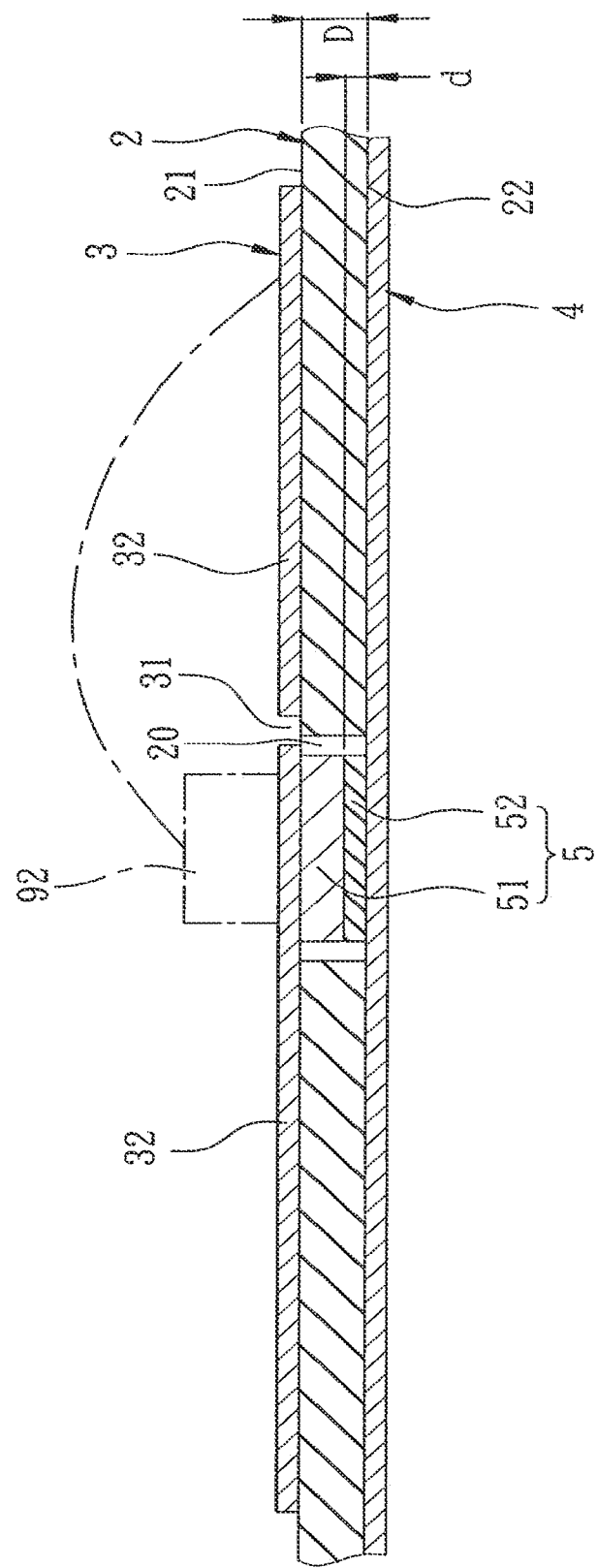
FIG. 6 is a schematic fragmentary sectional view to illustrate the second preferred embodiment of a ceramic circuit board according to this invention, which is used for packaging a vertically structured light emitting diode.

Referring to FIG. 6, the second preferred embodiment of the ceramic circuit board according to the present invention is similar to the first preferred embodiment except that the gap 31 of the top copper pattern 3 partially exposes the through-hole 20 of the ceramic substrate 2 and that one of the conducting portions 32 of the top copper pattern 3 contacts the heat-dissipating layer 51 of the heat-dissipating unit 5. Namely, the heat-dissipating layer 51 is hidden between the top copper pattern 3 and the bottom copper layer 4. The second preferred embodiment of the ceramic circuit board of this invention is adapted for both of the horizontally structured LED 91 (see FIG. 3) and a vertically structured LED 92.

Referring to FIG. 7, the third preferred embodiment of the method according to the present invention is conducted to make the ceramic circuit board as shown in FIG. 6, and step (a) thereof includes: (a1) forming the through-hole 20 extending through the opposite first and second surfaces 21,22 of the ceramic substrate 2; (a2) sinter-bonding the top and bottom copper layers 3',4 respectively to the first and second surfaces 21,22 of the ceramic substrate 2 via the heat treatment after step (a1); and (a3) patterning the top copper layer 3' to form the two conducting portions 32. Step (b) of the third preferred embodiment of the method includes sinter-bonding the heat-dissipating unit 5 to the bottom copper layer 4 in the through-hole 20 of the ceramic substrate 2 simultaneously with step (a2) via the heat treatment. In this embodiment, when steps (a2) and (b) are conducted together, the heat-dissipating unit 5 is sinter-bonded to both of the top and bottom copper layers 3',4.

Compared to the ceramic substrate 10 of the conventional ceramic circuit board 1, by virtue of the heat-dissipating unit 5 that has the heat-dissipating layer 51 with larger thermal conductivity and the ceramic layer 52 with the smaller thickness (d), the ceramic circuit board of this invention is able to efficiently dissipate the heat from the electronic element, thereby increasing the service life and the efficiency of the electronic element.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. A method of making a ceramic circuit board for use in packaging an electronic element, comprising:
    (a) providing a ceramic-copper plate that includes top and bottom copper layers, a ceramic substrate between said top and bottom copper layers, and a through-hole formed in the ceramic substrate; and
    (b) providing a heat-dissipating unit on the bottom copper layer and within the through-hole for dissipating heat from the electronic element;
    wherein step (a) comprises:
        (a1) forming the through-hole that extends through first and second surfaces of the ceramic substrate;
        (a2) sinter-bonding the top and bottom copper layers respectively to the first and second surfaces of the ceramic substrate after step (a1); and
        (a3) patterning the top copper layer to form two conducting portions after step (a2); and wherein, in step (b), the heat-dissipating unit is provided on the bottom copper layer in the through-hole of the ceramic substrate by a sinter-bonding process; and wherein a gap between the two conducting portions exposes the through-hole entirely.

2. The method of claim 1, wherein the top copper layer is formed into a top copper pattern that has at least two conducting portions separated from each other.

3. The method of claim 2, wherein the top and bottom copper layers are sinter-bonded to the ceramic substrate, and the heat-dissipating unit is sinter-bonded to the bottom copper layer.

4. The method of claim 1, wherein the heat-dissipating unit has a heat-dissipating layer with a thermal conductivity larger than that of the ceramic substrate, and a ceramic layer that underlies the heat-dissipating layer, the ceramic layer of the heat-dissipating unit being sinter-bonded to the bottom copper layer within the through-hole and having a thickness ranging from 0.02 mm to 0.2 mm, the ceramic substrate having a thickness larger than 0.2 mm, the thermal conductivity of the heat-dissipating layer of the heat-dissipating unit being larger than 170 $Wm^{-1}K^{-1}$.

5. The method of claim 4, wherein the heat-dissipating layer of the heat-dissipating unit is made of copper, the ceramic layer of the heat-dissipating unit being formed by a thermal spraying technique.

6. A method of making a ceramic circuit board for use in packaging an electronic element, comprising:
    (a) providing a ceramic-copper plate that includes top and bottom copper layers, a ceramic substrate between said top and bottom copper layers, and a through-hole formed in the ceramic substrate; and
    (b) providing a heat-dissipating unit on the bottom copper layer and within the through-hole for dissipating heat from the electronic element;
    wherein step (a) includes:
        (a1) sinter-bonding the top copper layer to a first surface of the ceramic substrate;
        (a2) patterning the top copper layer to form two conducting portions after step (a1);
        (a3) forming the through-hole in the ceramic substrate after step (a2); and
        (a4) sinter-bonding the bottom copper layer to a second surface of the ceramic substrate opposite to the first surface after step (a3); and
    wherein, in step (b), the heat-dissipating unit is provided on the bottom copper layer in the through-hole of the ceramic substrate by a sinter-bonding process.

7. The method of claim 6, wherein the heat-dissipating unit includes a heat-dissipating layer that has a thermal conductivity larger than that of the ceramic substrate, and a ceramic layer that underlies the heat-dissipating layer, the ceramic layer of the heat-dissipating unit being sinter-bonded to the bottom copper layer and having a thickness ranging from 0.02 mm to 0.2 mm, the ceramic substrate having a thickness larger than 0.2 mm, the thermal conductivity of the heat-dissipating layer of the heat-dissipating unit being larger than 170 $Wm^{-1}K^{-1}$.

8. The method of claim 7, wherein the heat-dissipating layer of the heat-dissipating unit is made of copper, the ceramic layer of the heat-dissipating unit being formed by a thermal spraying technique.

9. A method of making a ceramic circuit board for use in packaging an electronic element, comprising:
    (a) providing a ceramic-copper plate that includes top and bottom copper layers, a ceramic substrate between said top and bottom copper layers, and a through-hole formed in the ceramic substrate; and
    (b) providing a heat-dissipating unit on the bottom copper layer and within the through-hole for dissipating heat from the electronic element;
    wherein step (a) includes:
        (a1) forming the through-hole extending through opposite first and second surfaces of the ceramic substrate;
        (a2) sinter-bonding the top and bottom copper layers respectively to the first and second surfaces of the ceramic substrate after step (a1); and
        (a3) patterning the top copper layer to form two conducting portions after step (a2); and
    wherein, in step (b), the heat-dissipating unit is provided on the bottom copper layer in the through-hole of the ceramic substrate by a sinter-bonding process simultaneously with the sinter-bonding of the top and bottom copper layers to the ceramic substrate.

10. The method of claim 9, wherein the heat-dissipating unit includes a heat-dissipating layer that has a thermal conductivity larger than that of the ceramic substrate, and a ceramic layer that underlies the heat-dissipating layer, the ceramic layer of the heat-dissipating unit being sinter-bonded to the bottom copper layer, the ceramic layer having a thickness ranging from 0.02 min to 0.2 mm, the ceramic substrate having a thickness larger than 0.2 mm, the thermal conductivity of the heat-dissipating layer being larger than 170 $Wm^{-1}K^{-1}$.

11. The method of claim 10, wherein the heat-dissipating layer of the heat-dissipating unit is made of copper, the ceramic layer of the heat-dissipating unit being formed by a thermal spraying technique.

* * * * *